(12) United States Patent
Yamashita et al.

(10) Patent No.: US 7,786,426 B2
(45) Date of Patent: Aug. 31, 2010

(54) IMAGING DEVICE WITH A COLOR FILTER THAT CONTAINS A LAYER ONLY COVERING THE SURROUNDING AREAS

(75) Inventors: Kazuyoshi Yamashita, Kanagawa (JP); Yoshiharu Kudoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/133,536

(22) Filed: Jun. 5, 2008

(65) Prior Publication Data
US 2008/0302952 A1    Dec. 11, 2008

(30) Foreign Application Priority Data
Jun. 6, 2007   (JP)   ............... 2007-149932

(51) Int. Cl.
*G01J 3/50*    (2006.01)
*H01L 27/00*   (2006.01)
*H04N 5/335*   (2006.01)

(52) U.S. Cl. ............... 250/226; 250/208.1; 250/214 R; 250/214.1; 348/273; 348/275

(58) Field of Classification Search ............... 250/226, 250/208.1, 214.1, 214 R, 239, 216; 348/273, 348/275; 257/431–436, 400
See application file for complete search history.

(56) References Cited

U.S. PATENT DOCUMENTS

| | | | | |
|---|---|---|---|---|
| 6,111,247 | A * | 8/2000 | Sengupta | 250/226 |
| 7,084,472 | B2 * | 8/2006 | Fukuyoshi et al. | 257/432 |
| 7,456,384 | B2 * | 11/2008 | Toda | 250/226 |
| 2006/0169878 | A1 * | 8/2006 | Kasano et al. | 250/226 |
| 2007/0194356 | A1 * | 8/2007 | Moon et al. | 257/291 |
| 2007/0295893 | A1 * | 12/2007 | Olsen et al. | 250/226 |

FOREIGN PATENT DOCUMENTS

| | | |
|---|---|---|
| JP | 01-194464 | 8/1989 |
| JP | 2005-347708 | 12/2005 |
| JP | 2006-096983 | 4/2006 |
| JP | 2006-156801 | 6/2006 |
| JP | 2006-173896 | 6/2006 |
| JP | 2006-317776 | 11/2006 |
| JP | 2007-013089 | 1/2007 |
| JP | 2007-115921 | 5/2007 |
| KR | 1999-0054304 | * 7/1996 |

* cited by examiner

OTHER PUBLICATIONS

Japanese Office Action issued on Apr. 14, 2009 corresponding to JP Application No. 2007-149932.

*Primary Examiner*—Georgia Y Epps
*Assistant Examiner*—Francis M Legasse, Jr.
(74) *Attorney, Agent, or Firm*—Sonnenschein Nath & Rosenthal LLP

(57) ABSTRACT

There is provided a solid-state imaging device including a substrate of which surface is provided with a pixel area where a plurality of pixels arranged, each pixel including a photoelectric converting element to receive light from a subject image and perform photoelectric conversion on the received light to generate signal charge, and a surrounding area that is positioned around the pixel area and that includes a surrounding circuit to process the signal charge generated by the photoelectric converting elements. The solid-state imaging device includes a color filter facing the substrate so as to receive the light from the subject image in a surface corresponding to the surface of the substrate and to allow the light to transmit therethrough onto the surface of the substrate. The color filter includes a first colored layer and a second colored layer.

5 Claims, 13 Drawing Sheets

FIG. 2
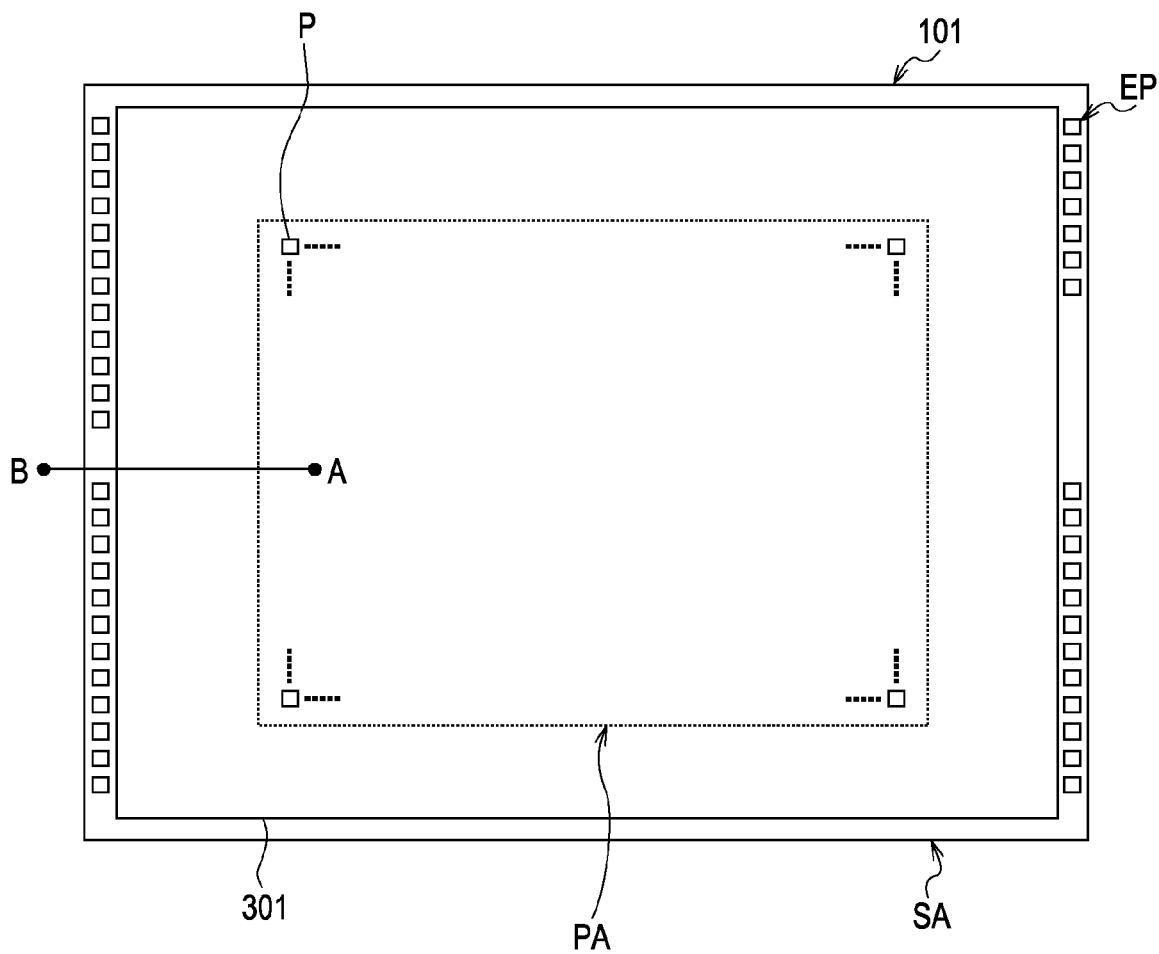
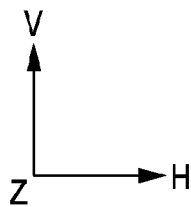

TO S/H AND CDS CIRCUIT

FIG. 4
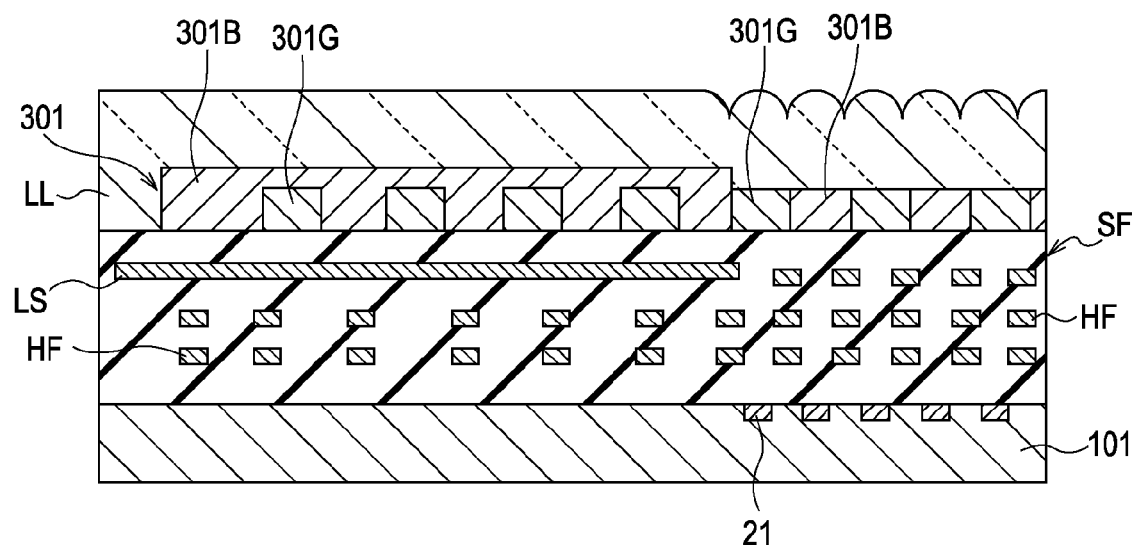
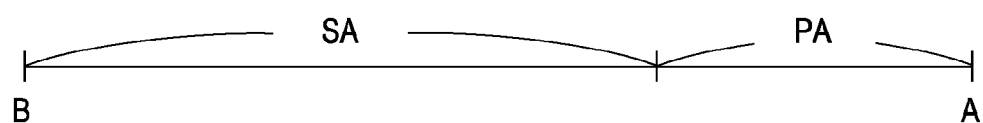
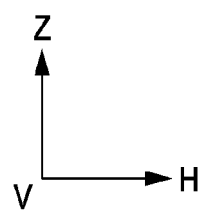

FIG. 8
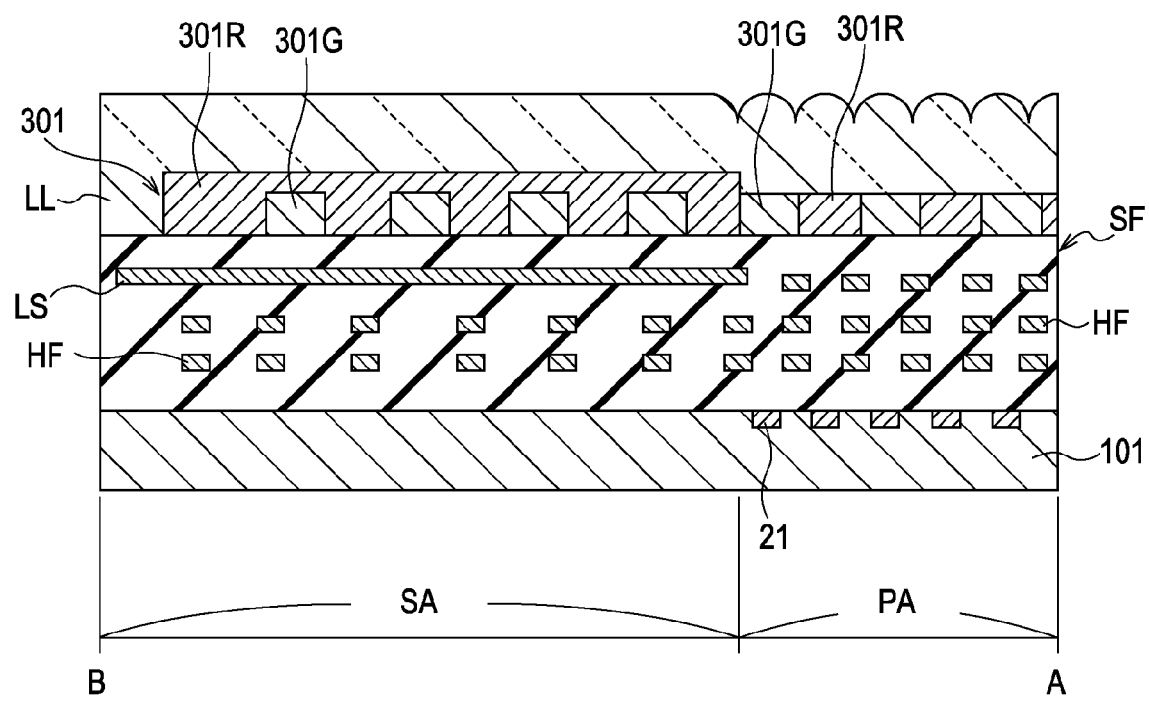
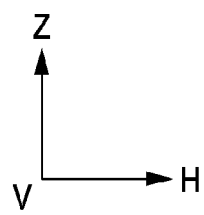

IMAGING DEVICE WITH A COLOR FILTER THAT CONTAINS A LAYER ONLY COVERING THE SURROUNDING AREAS

CROSS REFERENCES TO RELATED APPLICATIONS

The present invention contains subject matter related to Japanese Patent Application JP 2007-149932 filed in the Japanese Patent Office on Jun. 6, 2007, the entire contents of which are incorporated herein by reference.

BACKGROUND OF THE INVENTION

1. Field of the Invention

The present invention relates to a solid-state imaging device, a color filter, a camera, and a method for manufacturing the color filter.

2. Description of the Related Art

Cameras including video cameras and digital still cameras include a solid-state imaging device, such as a CMOS (complementary metal oxide semiconductor) image sensor or a CCD (charge coupled device) image sensor. In the solid-state imaging device, a pixel area provided with a plurality of pixels and a surrounding area positioned around the pixel area are provided on a surface of a semiconductor substrate. In the pixel area, a plurality of photoelectric converting elements corresponding to the plurality of pixels are placed. The photoelectric converting elements receive light from a subject image and perform photoelectric conversion on the received light so as to generate signal charge. In the surrounding area, a surrounding circuit to process the signal charge generated by the photoelectric converting elements is provided (e.g., see Patent Document 1: Japanese Unexamined Patent Application Publication No. 2007-13089).

In the solid-state imaging device, a color filter is provided such that the color filter faces the surface of the semiconductor substrate. The color filter receives light from a subject image and allows a light component of a predetermined wavelength band in the light to transmit therethrough in a surface corresponding to the surface of the semiconductor substrate. Accordingly, the light transmitted through the color filter is colored. Then, the colored light is emitted from the color filter to the pixel area on the surface of the semiconductor substrate (e.g., see Patent Document 2: Japanese Unexamined Patent Application Publication No. 2006-96983).

In an area of the color filter corresponding to the pixel area, a plurality of colored arrays including a plurality of colored layers are regularly placed so that light from a subject image transmits therethrough as colored light beams of three primary colors: red, blue, and green. For example, segments of colored layers of a plurality of colors are arranged in accordance with colored arrays called "Bayer arrays" such that the segments correspond to the respective pixels. For example, a coating liquid containing a coloring agent and a photoresist material is applied by a coating method, such as a spin coat method, to form a coating film, and then the coating film is patterned by a lithography technique. Accordingly, colored layers of respective colors are formed in accordance with the colored arrays (e.g., see Patent Document 3: Japanese Unexamined Patent Application Publication No. 2006-317776).

In an area of the color filter corresponding to the surrounding area, a light reflection preventing layer to prevent reflection of light from a metallic material in the surrounding area is provided in order to suppress degradation of image quality due to occurrence of flare in a captured image. The light reflection preventing layer is formed by laminating a plurality of colored layers corresponding to the pixel area in a solid pattern in the surrounding area, for example (e.g., see Patent Document 4: Japanese Unexamined Patent Application Publication No. 01-194464).

SUMMARY OF THE INVENTION

However, even if the light reflection preventing layer is formed, it may be difficult to sufficiently suppress flare. For example, when a red layer and a blue layer are laminated in a solid manner in the surrounding area, green light transmits. In that case, green flare may occur and degradation of image quality may become apparent.

When a color filter is provided as described above, it may be difficult to form the color filter having an even thickness. In that case, unevenness may occur in a captured image and image quality may degrade.

Furthermore, light may enter a surrounding circuit provided in the surrounding area. In that case, noise in a longitudinal line shape may occur in a captured image and thus image quality may degrade.

Particularly, when a coating film is formed to be extended from the center to the periphery of the pixel area by a spin coat method, the coating film may be thinner at the periphery than at the center. Thus, if the coating film is patterned to form colored arrays, a frame-like unevenness may occur in a captured image due to the variation in film thickness. Also, incident light to the surrounding circuit provided in the surrounding area may not be sufficiently shielded. As a result, the above-described problems may become apparent.

For example, in an SOC (system on chip) method in which a plurality of electronic circuits are mounted on a semiconductor substrate in a CMOS image sensor, the area occupied by the surrounding area should be large in the semiconductor substrate. As a result, the above-described problems may become more apparent.

As described above, in the solid-state imaging device, problems of flare, frame-like unevenness, and noise in a longitudinal line shape may occur in a captured image due to a color filter, which may degrade image quality.

Accordingly, the present invention provides a solid-state imaging device, a color filter, a camera, and a method for manufacturing the color filter, enabling improvement of image quality.

According to an embodiment of the present invention, there is provided a solid-state imaging device including a substrate of which surface is provided with a pixel area where a plurality of pixels are arranged, each pixel including a photoelectric converting element to receive light from a subject image and perform photoelectric conversion on the received light to generate signal charge, and a surrounding area that is positioned around the pixel area and that includes a surrounding circuit to process the signal charge generated by the photoelectric converting elements. The solid-state imaging device includes a color filter facing the substrate so as to receive the light from the subject image in a surface corresponding to the surface of the substrate and to allow the light to transmit therethrough onto the surface of the substrate. The color filter includes a first colored layer that has high light transmittance in a first wavelength band and that allows the light from the subject image to transmit therethrough and a second colored layer that has high light transmittance in a second wavelength band different from the first wavelength band and that allows the light from the subject image to transmit therethrough. A plurality of colored arrays of segments of the first and second colored layers are arranged in the surface corresponding to the surface of the substrate in the pixel area and the surrounding area, the colored arrays corresponding to the plurality of pixels in the pixel area. In the surrounding area, the second colored layer covers the plurality of colored arrays placed in the surrounding area in the surface corresponding to the surface of the substrate.

Preferably, the second colored layer covers a side surface of an endmost colored array among the plurality of colored arrays placed in the surrounding area.

Preferably, the color filter includes a third colored layer that has high light transmittance in a third wavelength band different from the first and second wavelength bands and that allows the light from the subject image to transmit therethrough. In the colored arrays of the color filter, segments of the third colored layer are arranged together with the segments of the first and second colored layers in the surface corresponding to the surface of the substrate.

Preferably, the first colored layer allows green light to transmit therethrough, the second colored layer allows red light to transmit therethrough, and the third colored layer allows blue light to transmit therethrough.

Preferably, the color filter includes a fourth colored layer having transmittance of allowing the light from the subject image to transmit lower than the transmittance of any of the first to third colored layers. The fourth colored layer is laminated on the colored arrays to cover the colored arrays in the surrounding area.

According to an embodiment of the present invention, there is provided a color filter to receive light from a subject image in a surface corresponding to a surface of a substrate and output colored light onto the surface of the substrate, in which a pixel area and a surrounding area face the surface of the substrate, the pixel area including a plurality of pixels arranged, each pixel including a photoelectric converting element to receive light from the subject image and perform photoelectric conversion on the received light to generate signal charge, the surrounding area being positioned around the pixel area and including a surrounding circuit to process the signal charge generated by the photoelectric converting elements. The color filter includes a first colored layer that has high light transmittance in a first wavelength band and that allows the light from the subject image to transmit therethrough; and a second colored layer that has high light transmittance in a second wavelength band different from the first wavelength band and that allows the light from the subject image to transmit therethrough. A plurality of colored arrays of segments of the first and second colored layers are arranged in the surface corresponding to the surface of the substrate in the pixel area and the surrounding area, the colored arrays corresponding to the plurality of pixels in the pixel area. In the surrounding area, the second colored layer covers the plurality of colored arrays placed in the surrounding area in the surface corresponding to the surface of the substrate.

According to an embodiment of the present invention, there is provided a camera including a solid-state imaging device including a substrate of which surface is provided with a pixel area where a plurality of pixels are arranged, each pixel including a photoelectric converting element to receive light from a subject image and perform photoelectric conversion on the received light to generate signal charge, and a surrounding area that is positioned around the pixel area and that includes a surrounding circuit to process the signal charge generated by the photoelectric converting elements. The solid-state imaging device includes a color filter facing the substrate so as to receive the light from the subject image in a surface corresponding to the surface of the substrate and to allow the light to transmit therethrough onto the surface of the substrate. The color filter includes a first colored layer that has high light transmittance in a first wavelength band and that allows the light from the subject image to transmit therethrough and a second colored layer that has high light transmittance in a second wavelength band different from the first wavelength band and that allows the light from the subject image to transmit therethrough. A plurality of colored arrays of segments of the first and second colored layers are arranged in the surface corresponding to the surface of the substrate in the pixel area and the surrounding area, the colored arrays corresponding to the plurality of pixels in the pixel area. In the surrounding area, the second colored layer covers the plurality of colored arrays placed in the surrounding area in the surface corresponding to the surface of the substrate.

According to an embodiment of the present invention, there is provided a method for manufacturing a color filter to receive light from a subject image in a surface corresponding to a surface of a substrate and allow the light to transmit therethrough onto the surface of the substrate, in which a pixel area and a surrounding area face the surface of the substrate, the pixel area including a plurality of pixels arranged, each pixel including a photoelectric converting element to receive light from the subject image and perform photoelectric conversion on the received light to generate signal charge, the surrounding area being positioned around the pixel area and including a surrounding circuit to process the signal charge generated by the photoelectric converting elements. The method includes the step of manufacturing the color filter including a first colored layer that has high light transmittance in a first wavelength band and that allows the light from the subject image to transmit therethrough; and a second colored layer that has high light transmittance in a second wavelength band different from the first wavelength band and that allows the light from the subject image to transmit therethrough, wherein a plurality of colored arrays of segments of the first and second colored layers are arranged in the surface corresponding to the surface of the substrate in the pixel area and the surrounding area, the colored arrays corresponding to the plurality of pixels in the pixel area. In the color filter manufacturing step, the color filter is manufactured so that the second colored layer covers the plurality of colored arrays placed in the surrounding area in the surface corresponding to the surface of the substrate.

Preferably, the color filter manufacturing step includes the steps of forming the first colored layer including a plurality of segments with gaps therebetween in accordance with the colored arrays in the surface corresponding to the surface of the substrate; and forming the second colored layer including a plurality of segments with gaps therebetween in accordance with the colored arrays in the surface corresponding to the surface of the substrate. In the first colored layer forming step, the first colored layer is formed in each of the pixel area and the surrounding area. In the second colored layer forming step, a coating film containing a coloring agent of the color corresponding to the second colored layer is applied to cover the surface provided with the first colored layer and to be laminated on the first colored layer in each of the pixel area and the surrounding area, and then patterning is performed to remove the coating film laminated on the first colored layer in the pixel area without removing the coating film laminated on the first colored layer in the surrounding area, so as to form the second colored layer.

Preferably, in the second colored layer forming step, the coating film containing the coloring agent of the color corresponding to the second colored layer is applied to cover a side surface of an endmost colored array among the plurality of colored arrays placed in the surrounding area, and then patterning is performed without removing the coating film formed to cover the side surface of the endmost colored array in the surrounding area, so as to form the second colored layer.

Preferably, in the color filter manufacturing step, the color filter is manufactured by placing a plurality of colored arrays in the pixel area and the surrounding area, the colored arrays including segments of a third colored layer that has high light transmittance in a third wavelength band different from the first and second wavelength bands and that allows the light from the subject image to transmit therethrough, the segments being arranged together with the segments of the first and second colored layers in the surface corresponding to the surface of the substrate.

Preferably, the color filter manufacturing step includes forming the third colored layer including segments with gaps therebetween corresponding to the colored arrays in the surface corresponding to the surface of the substrate. In the third colored layer forming step, a coating film containing a coloring agent of the color corresponding to the third colored layer is applied to cover the surface provided with the first colored layer and to be laminated on the first colored layer in the pixel area and the surrounding area, and then the coating film laminated on the first colored layer in the pixel area and the surrounding area is removed, so as to form the third colored layer. In the second colored layer forming step, a coating film containing a coloring agent of the color corresponding to the second colored layer is applied to cover the surface provided with the first and third colored layers and to be laminated on the first and third colored layers in the pixel area and the surrounding area, and then the coating film laminated on the first and third colored layers in the pixel area is removed without removing the coating film laminated on the first and third colored layers in the surrounding area, so as to form the second colored layer.

Preferably, the first colored layer allowing green light to transmit therethrough is formed in the first colored layer forming step, the second colored layer allowing red light to transmit therethrough is formed in the second colored layer forming step, and the third colored layer allowing blue light to transmit therethrough is formed in the third colored layer forming step.

Preferably, the color filter manufacturing step includes forming a fourth colored layer having light transmittance of allowing light from the subject image to transmit lower than the transmittance of any of the first, second, and third colored layers. In the fourth colored layer forming step, the fourth colored layer is formed to cover the colored arrays and to be laminated on the colored arrays in the surrounding area.

According to the above-described embodiments of the present invention, colored arrays of a plurality of colored layers are placed so that the colored arrays correspond to a plurality of pixels in the pixel area, and are also placed in the surrounding area. In the surrounding area, one of the plurality of colored layers covers a plurality of colored arrays placed in the surrounding area in a surface corresponding to a surface of a substrate. With this configuration in which the plurality of colored layers are laminated in the surrounding area, light reflectance in the surrounding area decreases.

Accordingly, a solid-state imaging device, a color filter, a camera, and a method for manufacturing the color filter, enabling improvement of image quality can be provided.

BRIEF DESCRIPTION OF THE DRAWINGS

FIG. 2 is a plan view schematically illustrating an entire configuration of a solid-state imaging device according to the first embodiment of the present invention;

FIG. 4 is a cross-sectional view of the solid-state imaging device according to the first embodiment of the present invention;

FIG. 8 is a cross-sectional view of a solid-state imaging device according to a second embodiment of the present invention;

DESCRIPTION OF THE PREFERRED EMBODIMENTS

Hereinafter, embodiments of the present invention are described with reference to the drawings.

First Embodiment (Configuration of Device)

Figure 1:
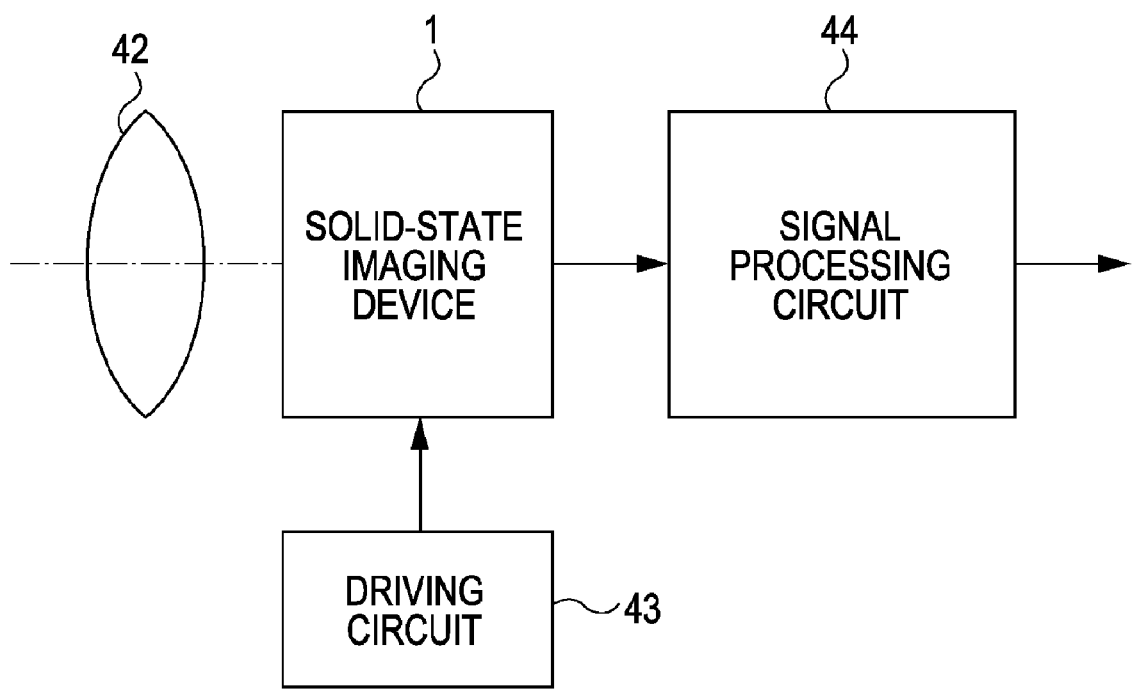
FIG. 1 illustrates a configuration of a camera according to a first embodiment of the present invention.

FIG. 1 illustrates a configuration of a camera 40 according to a first embodiment of the present invention.

As illustrated in FIG. 1, the camera 40 includes a solid-state imaging device 1, an optical system 42, a driving circuit 43, and a signal processing circuit 44. The respective devices are sequentially described below.

The solid-state imaging device 1 receives, on its light-receiving surface, light from a subject image via the optical system 42, and then performs photoelectric conversion on the light so as to generate signal charge. The solid-state imaging device 1 is driven based on driving signals output from the driving circuit 43. Specifically, the solid-state imaging device 1 reads signal charge and outputs it as raw data. The details of the solid-state imaging device 1 are described below.

The optical system 42 includes an optical lens, for example, and forms a subject image on the light-receiving surface of the solid-state imaging device 1.

The driving circuit 43 outputs various driving signals to the solid-state imaging device 1 in order to drive the solid-state imaging device 1.

The signal processing circuit 44 performs signal processing on the raw data output from the solid-state imaging device 1 and generates an image of a subject as digital signals.

Hereinafter, the entire configuration of the solid-state imaging device 1 is described.

FIG. 2 is a plan view schematically illustrating the entire configuration of the solid-state imaging device 1 according to the first embodiment of the present invention.

The solid-state imaging device 1 according to this embodiment is a CMOS image sensor and includes a substrate 101 as illustrated in FIG. 2. The substrate 101 is a semiconductor substrate made of silicon, and a surface of the substrate 101 is provided with a pixel area PA and a surrounding area SA as illustrated in FIG. 2.

As illustrated in FIG. 2, the pixel area PA on the substrate 101 is rectangular, and a plurality of pixels P are arranged therein in a matrix pattern along the vertical direction V and the horizontal direction H.

On the other hand, the surrounding area SA on the substrate 101 is positioned around the pixel area PA, and pad electrodes EP are placed at its ends. Also, a surrounding circuit (not illustrated) to process signal charge generated in the pixels P is provided in the surrounding area SA. Specifically, the surrounding circuit includes a vertical selecting circuit, an S/H (sample/hold) and CDS (correlated double sampling) circuit, a horizontal selecting circuit, a timing generator (TG), an AGC (automatic gain control) circuit, an A/D converting circuit, and a digital amplifier, and is connected to the pad electrodes EP.

Figure 3:
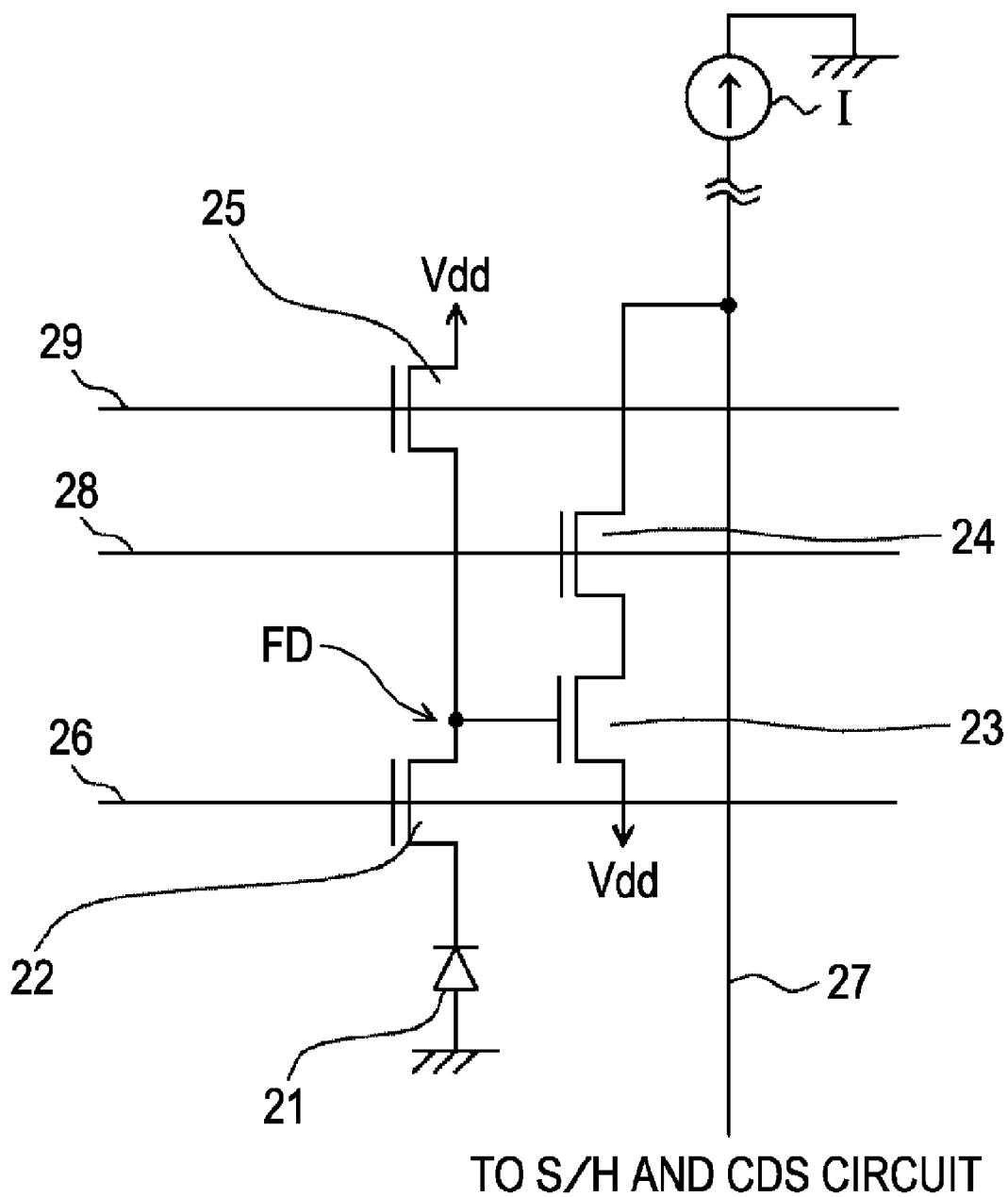
FIG. 3 is a circuit diagram of a pixel provided in a pixel area according to the first embodiment of the present invention.

FIG. 3 is a circuit diagram of the pixel P provided in the pixel area PA according to the first embodiment of the present invention.

As illustrated in FIG. 3, the pixel P provided in the pixel area PA includes a photodiode 21, a transfer transistor 22, an amplifier transistor 23, an address transistor 24, and a reset transistor 25.

The photodiode 21 receives, on its light-receiving surface, light from a subject image, and performs photoelectric conversion on the received light so as to generate and accumulate signal charge. As illustrated in FIG. 3, the photodiode 21 connects to the gate of the amplifier transistor 23 via the transfer transistor 22. The signal charge accumulated in the photodiode 21 is transferred as an output signal to a floating diffusion FD, connected to the gate of the amplifier transistor 23, by the transfer transistor 22.

As illustrated in FIG. 3, the transfer transistor 22 is provided between the photodiode 21 and the floating diffusion FD. When the gate of the transfer transistor 22 is supplied with a transfer pulse through a transfer line 26, the transfer transistor 22 transfers the signal charge accumulated in the photodiode 21 as an output signal to the floating diffusion FD.

As illustrated in FIG. 3, the amplifier transistor 23, the gate thereof connecting to the floating diffusion FD, amplifies an output signal output via the floating diffusion FD. The amplifier transistor 23 connects to a vertical signal line 27 via the address transistor 24 and constitutes a source follower together with a constant current source I provided outside the pixel area PA. When an address signal is supplied to the address transistor 24, the output signal output from the floating diffusion FD is amplified by the amplifier transistor 23.

As illustrated in FIG. 3, the gate of the address transistor 24 connects to an address line 28 through which an address signal is supplied. The address transistor 24 is turned ON when being supplied with an address signal and outputs the output signal amplified by the amplifier transistor 23 to the vertical signal line 27. The output signal is then output to the S/H and CDS circuit through the vertical signal line 27.

As illustrated in FIG. 3, the reset transistor 25, the gate thereof connecting to a reset line 29 through which a reset signal is supplied, is provided between a power supply Vdd and the floating diffusion FD. When the gate of the reset transistor 25 is supplied with a reset signal through the reset line 29, the reset transistor 25 resets the potential of the floating diffusion FD to the potential of the power supply Vdd.

The above-described pixel driving operation is performed on a plurality of pixels in units of rows at the same time because the respective gates of the transfer transistor 22, the address transistor 24, and the reset transistor 25 are connected in units of rows including a plurality of pixels arranged in the horizontal direction H. Specifically, the pixels are sequentially selected by address signals supplied by the vertical selecting circuit, in units of horizontal lines (pixel rows) in the vertical direction V. Also, the transistors of the respective pixels are controlled by various pulse signals supplied from the timing generator. Accordingly, output signals of the respective pixels are read to the S/H and CDS circuit through the vertical signal line 27 in units of pixel columns.

Hereinafter, the details of the solid-state imaging device 1 according to this embodiment are described.

FIG. 4 is a cross-sectional view of the solid-state imaging device 1 according to the first embodiment of the present invention. Specifically, FIG. 4 illustrates a main part of the cross-section taken along the line A-B in FIG. 2, that is, the part from an end of the pixel area PA over the surrounding area SA. As described above, the pixels P are placed on the substrate 101 in the pixel area PA. However, the respective elements constituting the pixels P are not illustrated, except the photodiodes 21. Also, the surrounding circuit placed in the surrounding area SA is not illustrated.

As illustrated in FIG. 4, the solid-state imaging device 1 according to this embodiment includes a color filter 301.

The color filter 301 faces the substrate 101, as illustrated in FIG. 4. The color filter 301 receives light from a subject image on the surface corresponding to the surface of the substrate 101, and then colored light is emitted onto the surface of the substrate 101. In this embodiment, the color filter 301 is placed on a flat plane so as to correspond to the surface of the substrate 101, as illustrated in FIG. 4.

As illustrated in FIG. 4, in the pixel area PA, the color filter 301 faces the surface of the substrate 101 via a plurality of wiring layers HF made of a metallic material and connected to the pixels P and an interlayer insulating film SF made of an insulating material and provided between the wiring layers HF.

On the other hand, in the surrounding area SA, the color filter 301 faces the surface of the substrate 101 via the plurality of wiring layers HF made of a metallic material and connected to the surrounding circuit, a light shielding layer LS to shield light entering the surrounding circuit, and the interlayer insulating film SF provided between the wiring layers HF or the light shielding layer LS.

As illustrated in FIG. 2, the color filter 301 does not cover the pad electrodes EP placed at the ends and extends in the surrounding area SA with a gap of about 1 mm from the part provided with the pad electrodes EP. With this configuration, when the substrate 101 is diced at the part corresponding to the ends after forming the pixel area PA on the substrate 101, peeling of the color filter 301 from the substrate 101 can be prevented because the color filter 301 is separated from the diced part.

Also, as illustrated in FIG. 4, a lens layer LL covers the surface of the color filter 301.

Figure 5A:
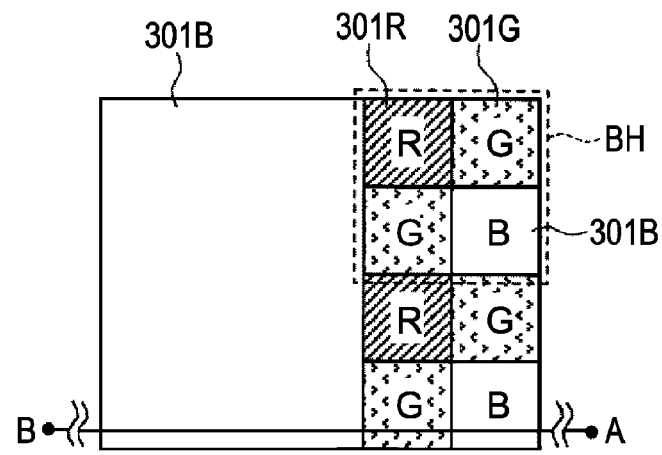
FIGS. 5A and 5B are enlarged plan views of a color filter according to the first embodiment of the present invention.
Figure 5B:
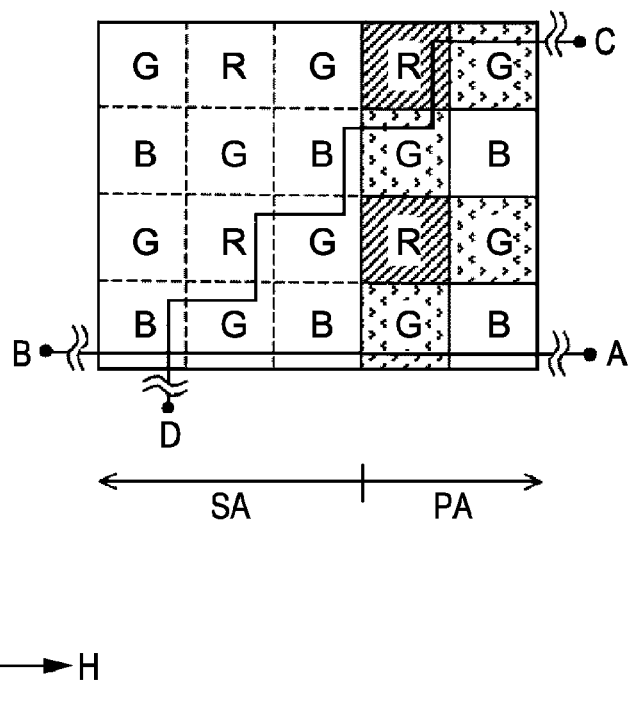

FIGS. 5A and 5B are enlarged plan views of the color filter 301 according to the first embodiment of the present invention. The part A-B in FIGS. 5A and 5B corresponds to the part A-B in FIG. 2, and FIGS. 5A and 5B illustrate a plane around the part A-B. FIG. 5A illustrates an upper surface of the color filter 301, whereas FIG. 5B illustrates an upper layer and a lower layer, which is indicated with broken lines.

Figure 6:
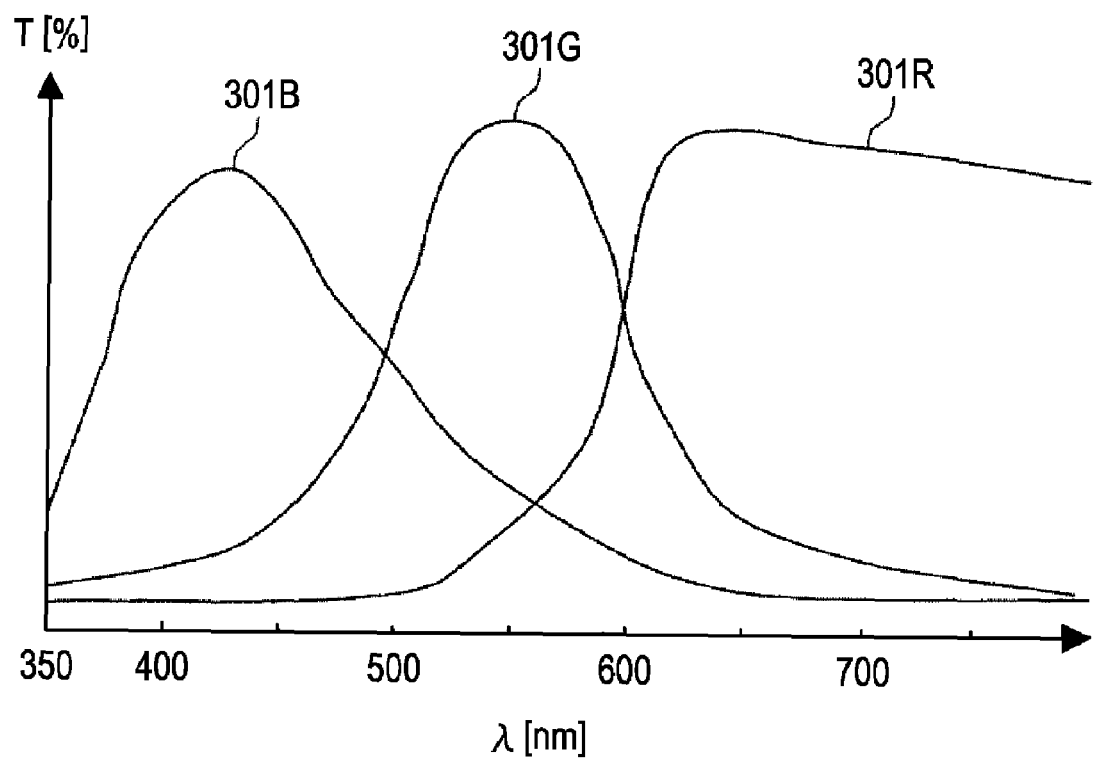
FIG. 6 illustrates a spectral characteristic of the color filter according to the first embodiment of the present invention.

FIG. 6 illustrates a spectral characteristic of the color filter 301 according to the first embodiment of the present invention. In FIG. 6, the horizontal axis indicates the wavelength of light (λ [nm]) and the vertical axis indicates transmittance of light (T [%]).

As illustrated in FIGS. 5A and 5B, the color filter 301 includes a red filter layer 301R, a green filter layer 301G, and a blue filter layer 301B.

As illustrated in FIG. 6, the red filter layer 301R in the color filter 301 has high light transmittance in a wavelength band corresponding to red and allows light from a subject image to transmit therethrough as red light. That is, the red filter layer 301R divides the light from the subject image so that red light transmits, in order to color the light from the subject image into red. The red filter layer 301R is formed by forming a coating film by applying a coating liquid containing a red pigment and a photoresist material (photoresistive resin) as a binder resin by a coating method, such as a spin coat method, and then patterning the coating film by a lithography technique. For example, the red filter layer 301R is formed to have a thickness of 500 to 1000 nm.

As illustrated in FIG. 6, the green filter layer 301G in the color filter 301 has high light transmittance in a wavelength band corresponding to green and allows light from a subject image to transmit therethrough as green light. Here, the green filter layer 301G has high light transmittance in the wavelength band corresponding to green, the wavelength band being different from the wavelength band where the red filter layer 301R allows red light to transmit therethrough. Specifically, in the green filter layer 301G, the wavelength of the highest light transmittance is different from that in the red filter layer 301R in the wavelength band where light transmits. The green filter layer 301G divides light from a subject image so that green light transmits therethrough, thereby coloring the light into green. The green filter layer 301G is formed by forming a coating film by applying a coating liquid containing a green pigment and a photoresist material by a coating method, such as a spin coat method, and then patterning the coating film by a lithography technique. For example, the green filter layer 301G is formed to have a thickness of 600 to 900 nm.

As illustrated in FIG. 6, the blue filter layer 301B in the color filter 301 has high light transmittance in a wavelength band corresponding to blue and allows light from a subject image to transmit therethrough as blue light. Here, the blue filter layer 301B has high light transmittance in the wavelength band corresponding to blue, the wavelength band being different from the wavelength bands where the red filter layer 301R and the green filter layer 301G allow red and green light to transmit therethrough. Specifically, in the blue filter layer 301B, the wavelength of the highest light transmittance is different from that in the red filter layer 301R and the green filter layer 301G in the wavelength band where light transmits. The blue filter layer 301B divides light from a subject image so that blue light transmits therethrough, thereby coloring the light into blue. The blue filter layer 301B is formed by forming a coating film by applying a coating liquid containing a blue pigment and a photoresist material by a coating method, such as a spin coat method, and then patterning the coating film by a lithography technique. For example, the blue filter layer 301B is formed to have a thickness of 300 to 1000 nm.

As illustrated in FIGS. 5A and 5B, the red, green, and blue filter layers 301R, 301G, and 301B are placed so that the segments thereof are arranged in Bayer arrays BH on the surface corresponding to the surface of the substrate 101. That is, in each Bayer array BH, one rectangular segment of the red filter layer 301R, one rectangular segment of the blue filter layer 301B, and two rectangular segments of the green filter layers 301G form a set, in which the two segments of the green filter layer 301G are diagonally opposite to each other and also the segments of the red filter layer 301R and the blue filter layer 301B are diagonally opposite to each other. A plurality of Bayer arrays BH, each including segments of the red, green, and blue filter layers 301R, 301G, and 301B, are sequentially arranged in the horizontal direction H and the vertical direction V.

Specifically, in the pixel area PA, the Bayer arrays BH are arranged such that they correspond to the plurality of pixels P, as illustrated in FIG. 5A. In other words, as illustrated in FIG. 4, the respective segments of the red, green, and blue filter layers 301R, 301G, and 301B constituting the Bayer arrays BH are arranged such that they face the light receiving surfaces of the photodiodes 21 constituting the pixels P. Also, in the pixel area PA, the red, green, and blue filter layers 301R, 301G, and 301B have the same thickness.

In the surrounding area SA, as in the pixel area PA, the segments of the red, green, and blue filter layers 301R, 301G, and 301B are arranged in Bayer arrays BH, as illustrated in FIG. 5B. That is, a plurality of Bayer arrays BH are arranged also in the surrounding area SA sequentially from the pixel area PA. In this embodiment, the Bayer arrays BH extend to the position just before the part provided with the pad electrodes EP at the ends of the substrate 101.

Furthermore, in the surrounding area SA, the blue filter layer 301B covers the plurality of Bayer arrays BH arranged in the surrounding area SA on the surface corresponding to the surface of the substrate 101, as illustrated in FIG. 5A.

That is, as illustrated in FIG. 4, the blue filter layer 301B is thicker than the green filter layer 301G and the red filter layer 301R in the surrounding area SA. As illustrated in FIGS. 5A and 5B, the red, green, and blue filter layers 301R, 301G, and 301B are arranged in Bayer arrays BH in a lower layer, and the blue filter layer 301B as an upper layer is laminated thereon.

Furthermore, in the surrounding area SA, the blue filter layer 301B covers a side surface of the endmost Bayer array BH, as illustrated in FIG. 4.

(Manufacturing Method)

Hereinafter, a manufacturing method for forming the above-described color filter 301 on the substrate 101 is described.

Figure 7:
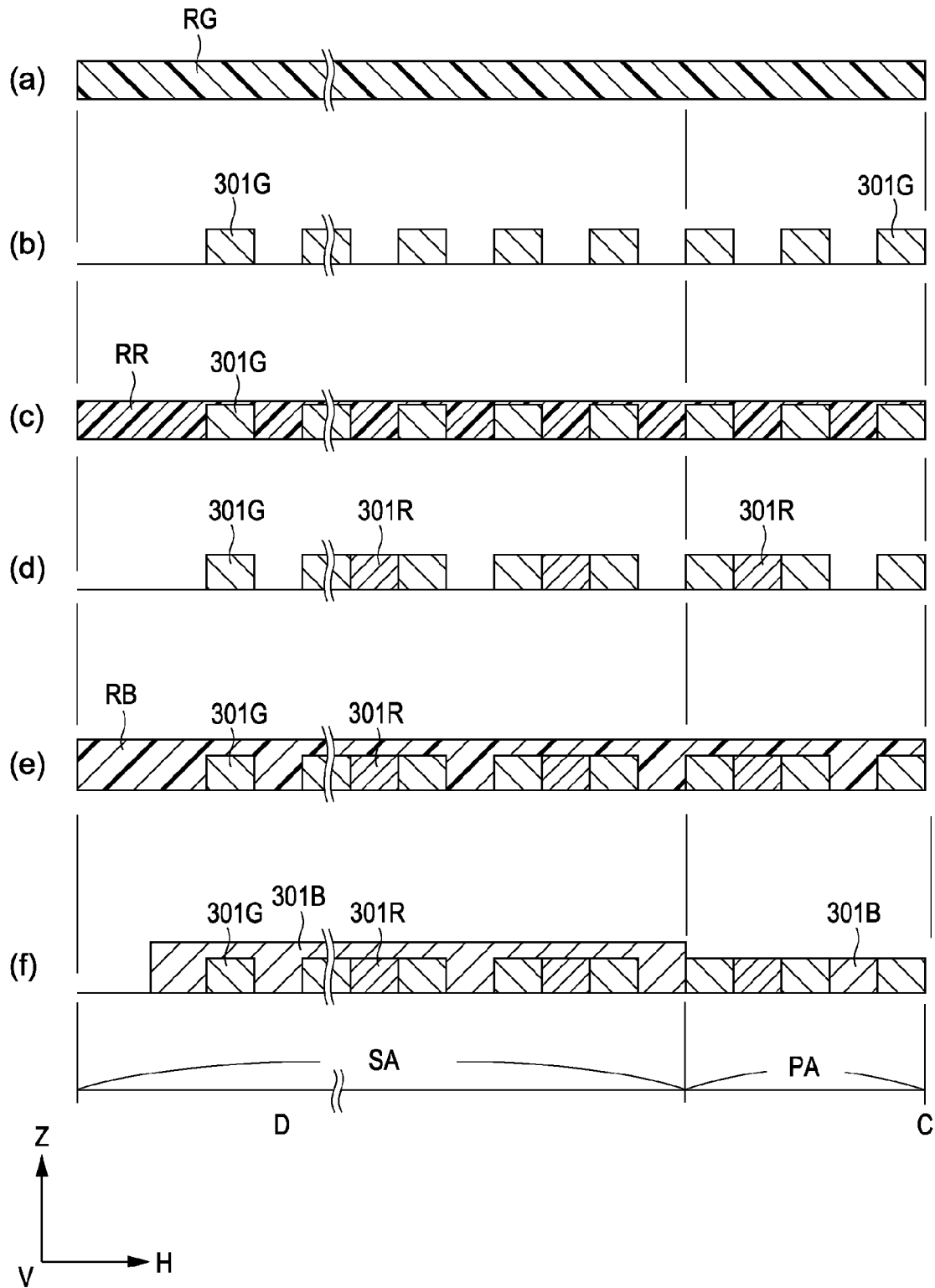
FIG. 7 includes cross-sectional views of a main part formed in respective steps of a method for forming the color filter according to the first embodiment of the present invention.

FIG. 7 includes cross-sectional views of a main part formed in respective steps of a method for forming the color filter 301 according to the first embodiment of the present invention. In FIG. 7, part C-D is a stepwise cross-section of part C-D in FIG. 5, illustrated as a plane.

First, a green resist film RG is formed as illustrated in (a).

Here, as described above, respective semiconductor elements constituting the pixels P and the surrounding circuit are formed in the substrate 101, the wiring layers HF, the light shielding layer LS, and the interlayer insulating film SF are formed, and then the surface thereof is smoothed. Then, a coating liquid containing a green coloring agent and a photoresist material is applied on the smoothed surface by a spin coat method, so as to form the green resist film RG. For example, a green pigment may be used as the coloring agent and an acrylic resin may be used as the photoresist material. The coating liquid may contain polymerization initiator or hardener.

In this embodiment, the green resist film RG is formed to cover each of the pixel area PA and the surrounding area SA.

Then, as illustrated in (b), the green resist film RG is patterned to form the green filter layer 301G.

Here, the green resist film RG is patterned in accordance with the Bayer arrays BH. Specifically, the green resist film RG is patterned so that a plurality of segments of the green filter layer 301G are arranged in a checkered pattern on the surface corresponding to the surface provided with the pixels P and the surrounding circuit in the substrate 101. More specifically, by sequentially performing exposure and development on the green resist film RG by a lithography technique, the green filter layer 301G is formed so that the pitches of the respective rectangular segments of the green filter layer 301G are equal.

In this embodiment, the respective segments of the green filter layer 301G are arranged in a checkered pattern in each of the pixel area PA and the surrounding area SA. That is, the green resist film RG is patterned in the above-described manner so that the same Bayer arrays BH are arranged in each of the pixel area PA and the surrounding area SA.

Then, a red resist film RR is formed as illustrated in (c).

Here, a coating liquid containing a red coloring agent and a photoresist material is applied on the surface provided with the green filter layer 301G by a spin coat method, so as to form the red resist film RR. For example, a red pigment may be used as the coloring agent and an acrylic resin may be used as the photoresist material.

In this embodiment, the red resist film RR is formed to cover each of the pixel area PA and the surrounding area SA, as the green resist film RG.

Specifically, the red resist film RR is formed to cover the surface provided with the green filter layer 301G and to be laminated on the green filter layer 301G in each of the pixel area PA and the surrounding area SA. That is, the red resist film RR is formed so that the red resist film RR is thicker than the green filter layer 301G. Accordingly, gaps between the segments of the green filter layer 301G are embedded with the red resist film RR and also the red resist film RR is laminated on the green filter layer 301G.

Then, as illustrated in (d), the red resist film RR is patterned to form the red filter layer 301R.

Here, the red resist film RR is patterned in accordance with the Bayer arrays BH. That is, the red resist film RR is patterned so that a plurality of segments of the red filter layer 301R are arranged at regular intervals on the surface corresponding to the surface provided with the pixels P and the surrounding circuit in the substrate 101. More specifically, by sequentially performing exposure and development on the red resist film RR by a lithography technique, the red filter layer 301R is formed.

In this embodiment, the red filter layer 301R is formed in each of the pixel area PA and the surrounding area SA. That is, the red resist film RR is patterned into the red filter layer 301R so that the same Bayer arrays BH are arranged in each of the pixel area PA and the surrounding area SA. Also, the red resist film RR is processed so that the thickness of the red filter layer 301R becomes the same as that of the green filter layer 301G.

Then, as illustrated in (e), a blue resist film RB is formed.

Here, the blue resist film RB is formed by coating the surface provided with the green filter layer 301G and the red filter layer 301R with a coating liquid containing a blue coloring agent and a photoresist material by a spin coat method. For example, a blue pigment may be used as the coloring agent and an acrylic resin may be used as the photoresist material.

In this embodiment, as the green resist film RG and the red resist film RR, the blue resist film RB is formed to cover each of the pixel area PA and the surrounding area SA, as illustrated in (e).

Specifically, the blue resist film RB is formed to cover the surface provided with the green filter layer 301G and the red filter layer 301R and to be laminated on the green filter layer 301G and the red filter layer 301R in each of the pixel area PA and the surrounding area SA. That is, the blue resist film RB is formed to be thicker than the green filter layer 301G and the red filter layer 301R. Accordingly, the gaps between the segments of the green filter layer 301G in which the red filter layer 301R is not formed are embedded with the blue resist film RB, and the blue resist film RB is laminated on the green filter layer 301G and the red filter layer 301R.

Furthermore, in the surrounding area SA, the blue resist film RB is formed to cover a side surface of the endmost Bayer array BH. That is, in this embodiment, the blue resist film RB extends to cover a side surface of the endmost segment of the green filter layer 301G or the red filter layer 301R in the surrounding area SA.

Then, as illustrated in (f), the blue resist film RB is patterned to form the blue filter layer 301B.

Here, the blue resist film RB is patterned in accordance with the Bayer arrays BH.

In this embodiment, as illustrated in (f), the blue filter layer 301B is formed by performing patterning so as to remove the blue resist film RB laminated on the green filter layer 301G and the red filter layer 301R in the pixel area PA. Specifically, in the pixel area PA, as in the steps of forming the green filter layer 301G and the red filter layer 301R, by sequentially performing exposure and development on the blue resist film RB by a lithography technique, the blue filter layer 301B is formed in accordance with the Bayer arrays BH. That is, the blue resist film RB is patterned so that a plurality of segments of the blue filter layer 301B are arranged with gaps therebetween and that the thickness of the blue filter layer 301B becomes the same as that of the green filter layer 301G and the red filter layer 301R on the surface corresponding to the surface provided with the pixels P and the surrounding circuit in the substrate 101.

On the other hand, in the surrounding area SA, the blue resist film RB laminated on the green filter layer 301G and the red filter layer 301R is not removed to maintain the laminated state, so that the blue filter layer 301B is formed. That is, the blue filter layer 301B is formed so that the thickness thereof becomes larger than that of the green filter layer 301G and the red filter layer 301R.

Furthermore, in the surrounding are SA, patterning is performed on the blue resist film RB so that the blue filter layer 301B covers a side surface of the endmost Bayer array BH.

As described above, in the solid-state imaging device 1 according to the first embodiment, the color filter 301 includes the red filter layer 301R, the green filter layer 301G, and the blue filter layer 301B, the respective segments of these layers being arranged in Bayer arrays BH corresponding to the plurality of pixels P in the pixel area PA. Also, the Bayer arrays BH are arranged in the surrounding area SA, as in the pixel area PA. In the surrounding area SA, the blue filter layer 301B covers a plurality of Bayer arrays BH in the surface corresponding to the surface of the substrate 101. With this configuration, in this embodiment, the blue filter layer 301B is laminated on the red filter layer 301R or the green filter layer 301G and light reflectance can be decreased, and thus occurrence of flare can be suppressed. When only a laminate of the red filter layer 301R and the blue filter layer 301B is formed in the surrounding area SA, green flare may occur in a captured image and image quality may degrade, as described above. However, in this embodiment, not only the laminate of the red filter layer 301R and the blue filter layer 301B but also a laminate of the green filter layer 301G and the blue filter layer 301B and the blue filter layer 301B alone are formed in the surrounding area SA. With this configuration, flare is almost white even if it occurs, and thus image quality can be enhanced.

That is, in the surrounding area SA, the blue filter layer 301B is laminated on the red filter layer 301R and also on the green filter layer 301G. Furthermore, the blue filter layer 301B in a non-laminated part is sufficiently thick. With this configuration, light transmittance decreases, and thus light reflection from the wiring layers made of a metallic material in the lower layer can be prevented.

Also, in this embodiment, the blue filter layer 301B is formed to cover a side surface of the endmost Bayer array BH in the surrounding area SA. With this configuration, peeling of the color filter 301 can be suppressed.

Furthermore, in this embodiment, the green filter layer 301G is formed in each of the pixel area PA and the surrounding area SA, and then the red resist film RR is applied to cover the surface provided with the green filter layer 301G and to be laminated on the green filter layer 301G in each of the pixel area PA and the surrounding area SA. Since the red resist film RR is applied to cover the plurality of segments of the green filter layer 301G, with gaps therebetween, in the pixel area PA and the surrounding area SA, the thickness of the red resist film RR is even in each of the pixel area PA and the surrounding area SA. In other words, since the green filter layer 301G is formed over the entire surface, an effect of an aperiodic step causing a difference in thickness becomes small and thus the red resist film RR can be formed in an even thickness. Then, patterning is performed on the red resist film RR having the even thickness so as to form the red filter layer 301R. Then, the blue resist film RB is applied to cover the surface provided with the green filter layer 301G and the red filter layer 301R and to be laminated on the green filter layer 301G and the red filter layer 301R in each of the pixel area PA and the surrounding area SA. As the red resist film RR, the blue resist film RB is applied to cover the respective segments of the green filter layer 301G, with gaps therebetween, in the pixel area PA and the surrounding area SA, so that the thickness of the blue resist film RB is even in each of the pixel area PA and the surrounding area SA. Then, patterning is performed on the blue resist film RB having the even thickness, so as to form the blue filter layer 301B. With this process of this embodiment, each of the red filter layer 301R, the green filter layer 301G, and the blue filter layer 301B in the color filter 301 can be easily formed in a desired thickness. Therefore, in this embodiment, variations in thickness of the red filter layer 301R, the green filter layer 301G, and the blue filter layer 301B can be prevented in the pixel area PA, so that occurrence of frame-like unevenness in a captured image can be prevented.

Second Embodiment (Configuration of Device)

FIG. 8 is a cross-sectional view of a solid-state imaging device 1 according to a second embodiment of the present invention. FIG. 8 illustrates a main part of the cross-section taken along the line A-B in FIG. 2, that is, the part from an end of the pixel area PA over the surrounding area SA. As in FIG. 4, pixels P are placed on the substrate 101 in the pixel area PA. However, the respective elements constituting the pixels P are not illustrated, except the photodiodes 21. Also, the surrounding circuit placed in the surrounding area SA is not illustrated.

Figure 9A:
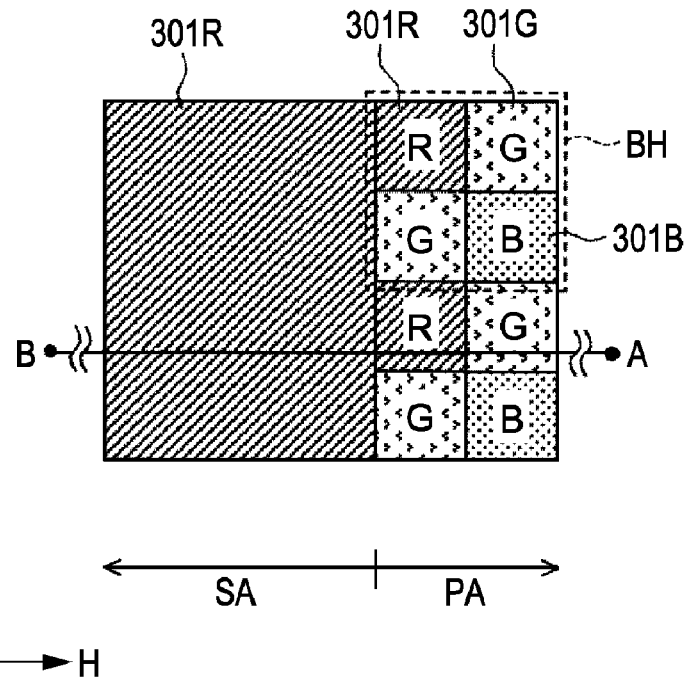
FIGS. 9A and 9B are enlarged plan views of a color filter according to the second embodiment of the present invention.
Figure 9B:
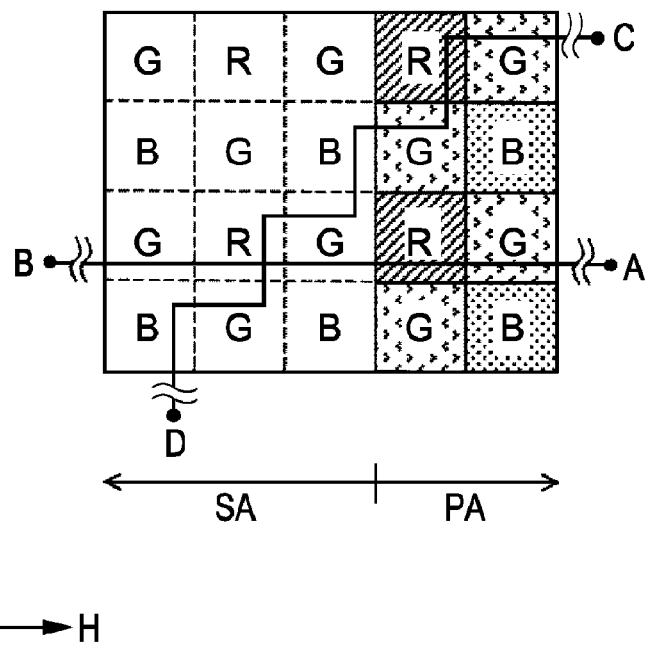

FIGS. 9A and 9B are enlarged plan views of a color filter 301 according to the second embodiment of the present invention. The part A-B in FIGS. 9A and 9B corresponds to the part A-B in FIG. 2, and FIGS. 9A and 9B illustrate a plane around the part A-B. FIG. 9A illustrates an upper surface of the color filter 301, whereas FIG. 9B illustrates a lower layer under an upper layer with broken lines.

As illustrated in FIGS. 8, 9A, and 9B, the solid-state imaging device 1 according to this embodiment includes the color filter 301 in which segments of the red, green, and blue filter layers 301R, 301G, and 301B are arranged in Bayer arrays BH. In this embodiment, however, as illustrated in FIGS. 8, 9A, and 9B, not the blue filter layer 301B but the red filter layer 301R is laminated on the Bayer arrays BH in the surrounding area SA. Other than that, the second embodiment is the same as the first embodiment, and thus the corresponding description is omitted.

Hereinafter, the color filter 301 according to the second embodiment is described in detail.

As illustrated in FIGS. 8, 9A, and 9B, the color filter 301 according to the second embodiment includes Bayer arrays BH corresponding to the plurality of pixels P in the pixel area PA, as in the first embodiment.

As in the pixel area PA, segments of the red filter layer 301R, the green filter layer 301G, and the blue filter layer 301B are arranged in Bayer arrays BH in the surrounding area SA, as illustrated in FIGS. 8, 9A, and 9B.

Furthermore, as illustrated in FIG. 9A, the red filter layer 301R covers the plurality of Bayer arrays BH arranged in the surrounding area SA in the surface corresponding to the surface of the substrate 101.

That is, as illustrated in FIG. 8, the red filter layer 301R is thicker than the green filter layer 301G and the blue filter layer 301B in the surrounding area SA. As illustrated in FIGS. 9A and 9B, segments of the red filter layer 301R, the green filter layer 301G, and the blue filter layer 301B are arranged in the Bayer arrays BH in a lower layer, and the red filter layer 301R is laminated thereon as an upper layer.

(Manufacturing Method)

Hereinafter, a manufacturing method for forming the above-described color filter 301 on the substrate 101 is described.

Figure 10:
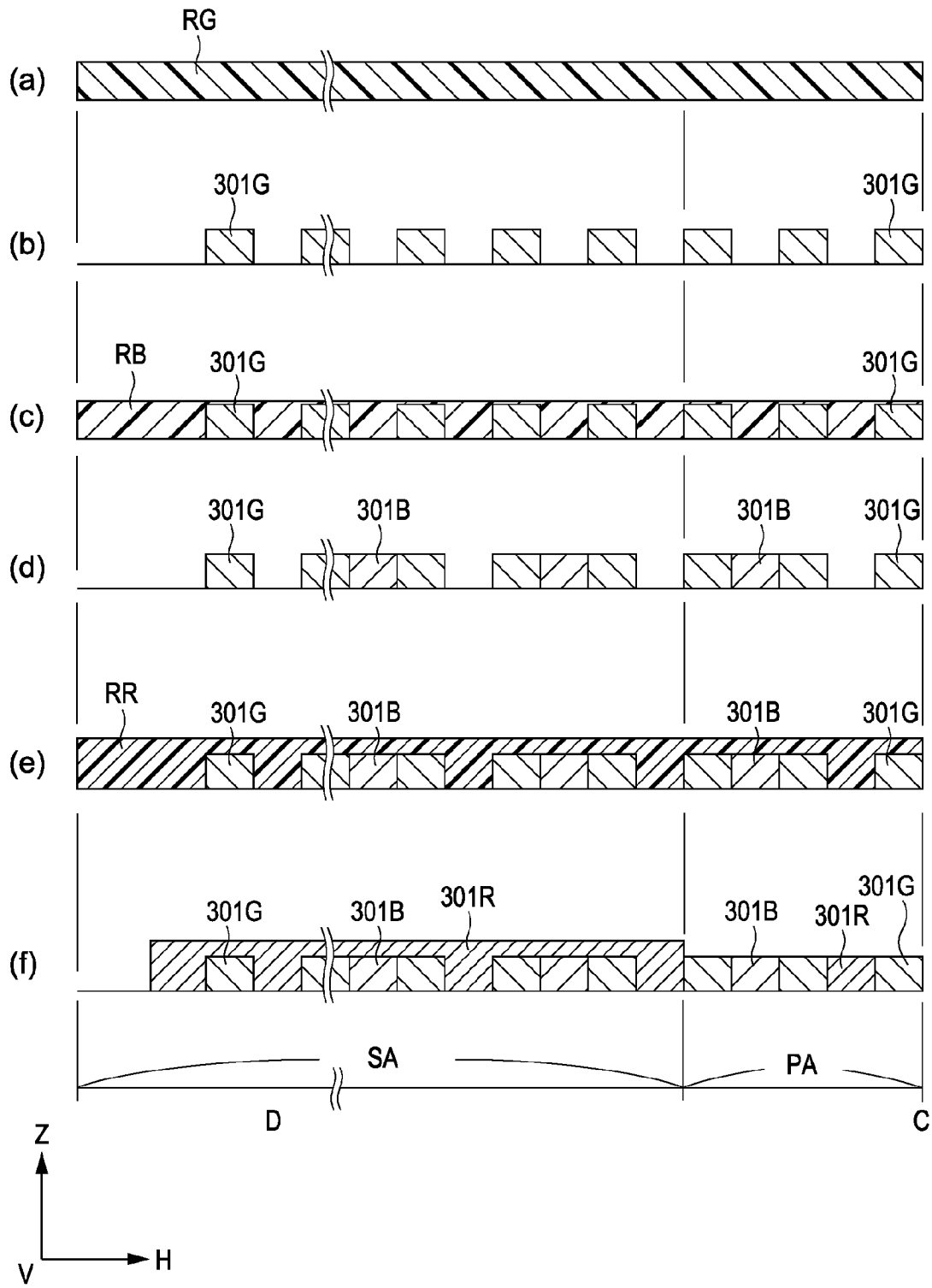
FIG. 10 includes cross-sectional views of a main part formed in respective steps of a method for forming the color filter according to the second embodiment of the present invention.

FIG. 10 includes cross-sectional views of a main part formed in respective steps of a method for forming the color filter 301 according to the second embodiment of the present invention. In FIG. 10, part C-D corresponds to part C-D illustrated in FIG. 9B, and a stepwise cross-section taken along part C-D is illustrated as a plane.

First, a green resist film RG is formed as in (a). Then, as illustrated in (b), the green resist film RG is patterned to form the green filter layer 301G.

As in the first embodiment, the green filter layer 301G is formed after the green resist film RG is formed.

Then, as illustrated in (c), a blue resist film RB is formed.

As in the first embodiment, the blue resist film RB is formed by applying a coating liquid containing a blue coloring agent and a photoresist material on the surface provided with the green filter layer 301G by a spin coat method. That is, as the green resist film RG, the blue resist film RB is formed to cover each of the pixel area PA and the surrounding area SA.

Then, as illustrated in (d), the blue resist film RB is patterned to form the blue filter layer 301B.

As in the first embodiment, the blue resist film RB is patterned in accordance with the Bayer arrays BH, so as to form the blue filter layer 301B. That is, the blue resist film RB is patterned into segments of the blue filter layer 301B so that the same Bayer arrays BH are arranged in each of the pixel area PA and the surrounding area SA.

Then, as illustrated in (e), a red resist film RR is formed.

As in the first embodiment, the red resist film RR is formed by applying a coating liquid containing a red coloring agent and a photoresist material on the surface provided with the green filter layer 301G and the blue filter layer 301B by a spin coat method. That is, as the green resist film RG and the blue resist film RB, the red resist film RR is formed to cover each of the pixel area PA and the surrounding area SA, as illustrated in (e).

Then, as illustrated in (f), the red resist film RR is patterned to from the red filter layer 301R.

Here, the red resist film RR is patterned in accordance with the Bayer arrays BH.

In this embodiment, as in the first embodiment, the red filter layer 301R is formed by performing patterning so as to remove the red resist film RR laminated on the green filter layer 301G and the blue filter layer 301B in the pixel area PA, as illustrated in (f).

On the other hand, in the surrounding area SA, the red resist film RR laminated on the green filter layer 301G and the blue filter layer 301B is not removed to maintain the laminated state, so that the red filter layer 301R is formed. That is, the red filter layer 301R is formed so that the thickness thereof becomes larger than that of the green filter layer 301G and the blue filter layer 301B.

As described above, in the color filter 301 according to this embodiment, the red filter layer 301R, not the blue filter layer 301B, is laminated on the Bayer arrays BH in the surrounding area SA. With this configuration according to the second embodiment, part of the red filter layer 301R is not laminated on any other primary-color filter, and thus light entered from the part is colored into red and is output to the surrounding circuit. On the other hand, in the first embodiment, part of the blue filter layer 301B is not laminated on any other primary-color filter in the surrounding area SA, and thus light entered from the part is colored into blue and is output to the surrounding circuit. Red light has a longer wavelength and lower energy compared to blue light. Therefore, as described above, even if light to enter the surrounding circuit is not shielded and is output to the surrounding circuit, the light has low energy and thus a trouble such as noise in a longitudinal line shape can be prevented from occurring in a captured image.

Third Embodiment (Configuration of Device)

Figure 11:
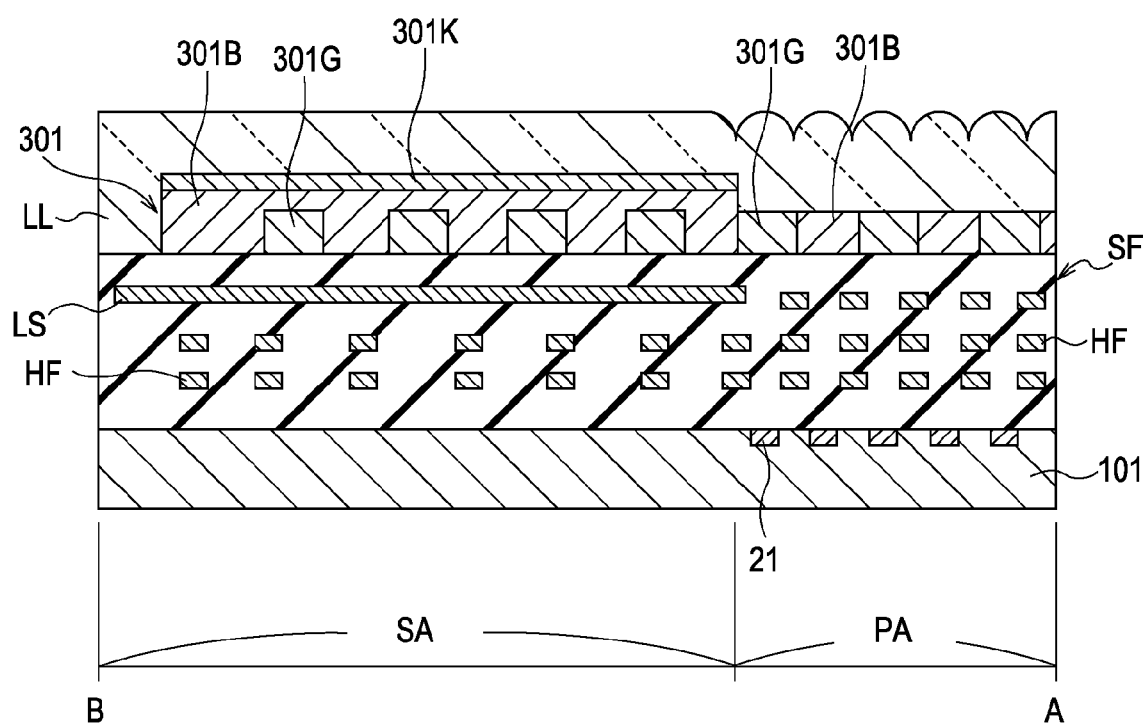
FIG. 11 is a cross-sectional view of a solid-state imaging device according to a third embodiment of the present invention.

FIG. 11 is a cross-sectional view of a solid-state imaging device 1 according to a third embodiment of the present invention. FIG. 11 illustrates a main part of the cross-section taken along the line A-B in FIG. 2, that is, the part from an end of the pixel area PA over the surrounding area SA. As in FIG. 4, pixels P are placed on the substrate 101 in the pixel area PA. However, the respective elements constituting the pixels P are not illustrated, except the photodiodes 21. Also, the surrounding circuit placed in the surrounding area SA is not illustrated.

Figure 12A:
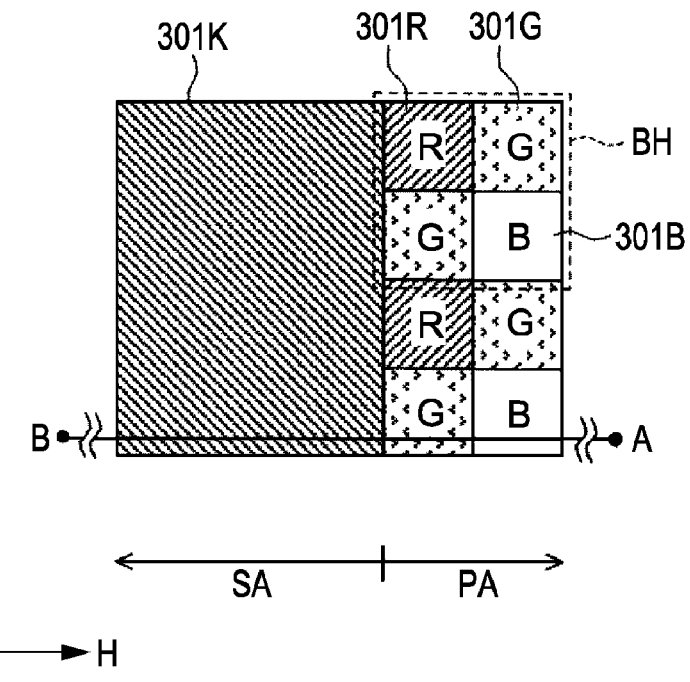
FIGS. 12A and 12B are enlarged plan views of a color filter according to the third embodiment of the present invention.
Figure 12B:
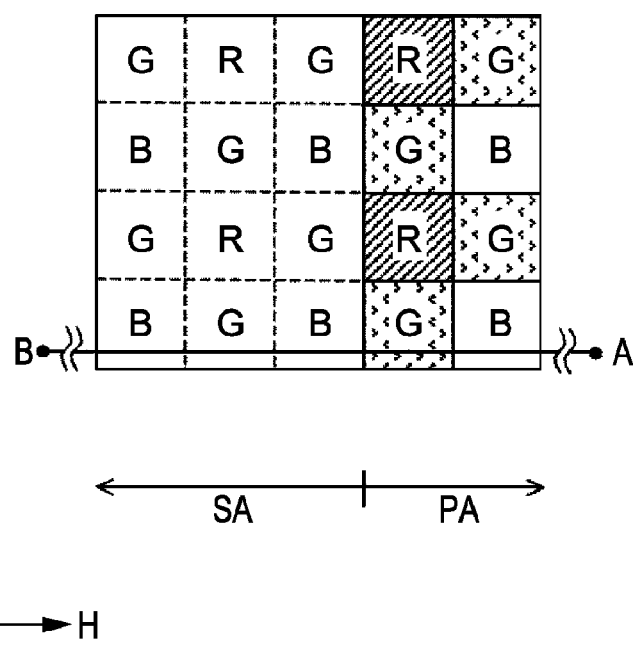

FIGS. 12A and 12B are enlarged plan views of a color filter 301 according to the third embodiment of the present invention. The part A-B in FIGS. 12A and 12B corresponds to the part A-B in FIG. 2, and FIGS. 12A and 12B illustrate a plane around the part A-B. FIG. 12A illustrates an upper surface of the color filter 301, whereas FIG. 12B illustrates a lower layer under an upper layer with broken lines.

As illustrated in FIGS. 11, 12A, and 12B, the solid-state imaging device 1 according to the third embodiment includes the color filter 301 in which segments of the red filter layer 301R, the green filter layer 301G, and the blue filter layer 301B are arranged in Bayer arrays BH. In this embodiment, however, as illustrated in FIGS. 11, 12A, and 12B, a black layer 301K is laminated on the Bayer arrays BH via the blue filter layer 301B in the surrounding area SA. Other than that, the third embodiment is the same as the first embodiment, and thus the corresponding description is omitted.

As illustrated in FIGS. 11, 12A, and 12B, the black layer 301K is laminated to cover the Bayer arrays BH and the blue filter layer 301B in the surrounding area SA. Here, the black layer 301K is formed so that its transmittance of light from a subject image is lower than the transmittance of each of the red filter layer 301R, the green filter layer 301G, and the blue filter layer 301B. The black layer 301K shields light.

The black layer 301K is formed by applying a coating liquid containing a black pigment and a photoresist material by a coating method such as a spin coat method so as to form a black resist film over an entire surface and then patterning the black resist film by a lithography technique. Specifically, the black layer 301K is formed to have a thickness of 100 to 800 nm.

As described above, in this embodiment, the black layer 301K is laminated on the Bayer arrays BH and the blue filter layer 301B in the surrounding area SA. With this configuration, incident light to the surrounding circuit can be shielded more effectively, and thus a trouble such as noise in a longitudinal line shape can be prevented from occurring in a captured image.

In the above-described embodiments, the solid-state imaging device 1 is an example of the solid-state imaging device in the claims. The camera 40 is an example of the camera in the claims. The substrate 101 is an example of the substrate in the claims. The pixel area PA is an example of the pixel area in the claims. The surrounding area SA is an example of the surrounding area in the claims. The photodiode 21 is an example of the photoelectric converting element in the claims. The color filter 301 is an example of the color filter in the claims. The red filter layer 301R is an example of the first, second, or third colored layer in the claims. Specifically, in the first or third embodiment, the red filter layer 301R corresponds to the first or third colored layer in the claims. On the other hand, in the second embodiment, the red filter layer 301R corresponds to the second colored layer in the claims. In the above-described embodiments, the green filter layer 301G is an example of the first or third colored layer in the claims. The blue filter layer 301B is an example of the first, second, or third colored layer in the claims. Specifically, in the first or third embodiment, the blue filter layer 301B corresponds to the second colored layer in the claims. On the other hand, in the second embodiment, the blue filter layer 301B corresponds to the first or third colored layer in the claims. The black layer 301K is an example of the fourth colored layer in the claims. The Bayer array BH is an example of the colored array in the claims.

The present invention is not limited to the above-described embodiments and various modifications can also be adopted.

For example, in the above-described embodiments, the segments of the red, green, and blue filter layers 301R, 301G, and 301B are arranged in the Bayer arrays BH. However, the present invention is not limited to this arrangement.

Figure 13A:
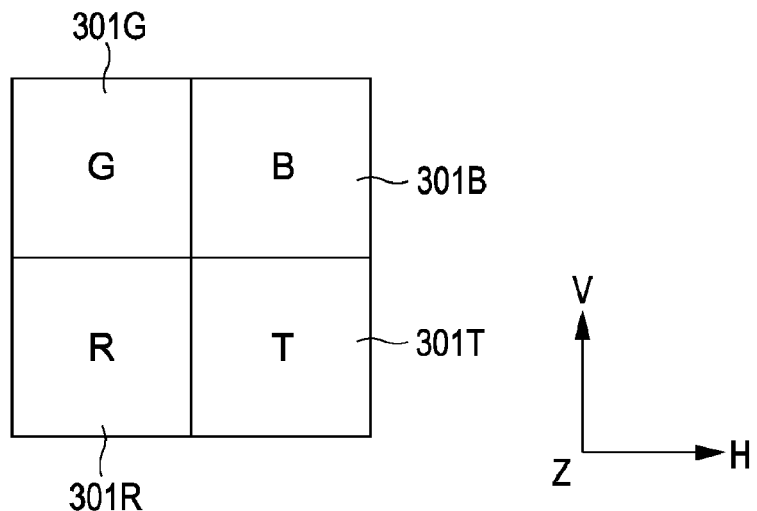
FIGS. 13A, 13B, and 13C illustrate modifications of a colored array of the color filter according to the embodiments of the present invention.
Figure 13B:
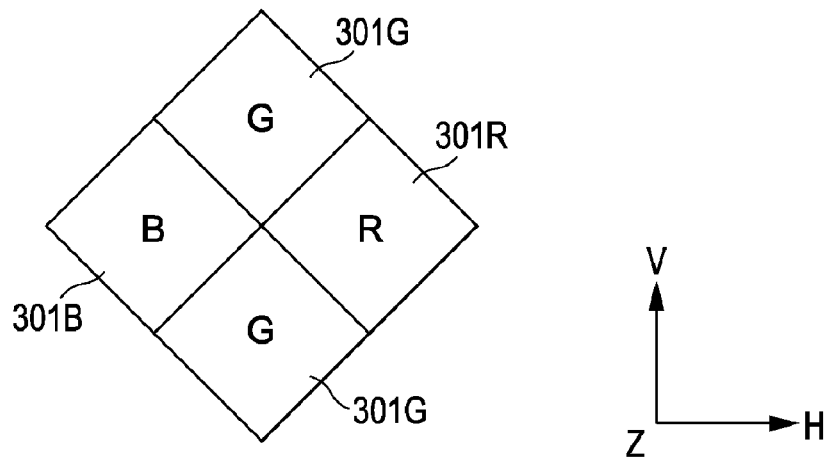
Figure 13C:
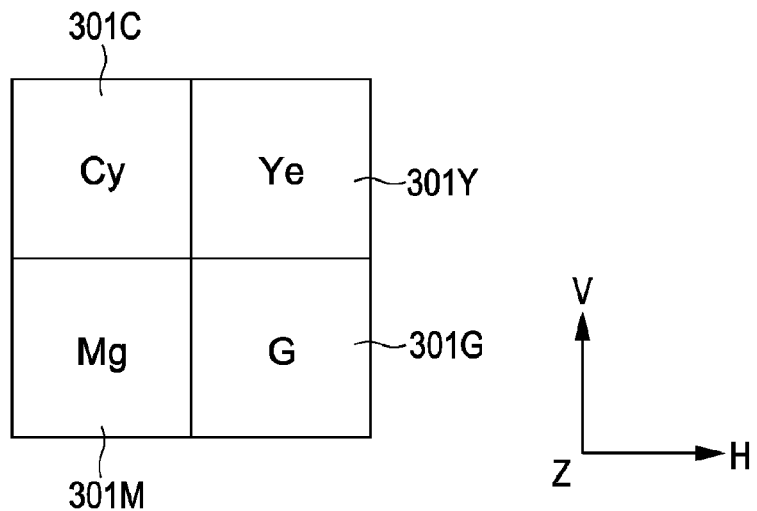

FIGS. 13A, 13B, and 13C illustrate modifications of a colored array in the color filter 301 according to the embodiments of the present invention.

As illustrated in FIG. 13A, one of the two segments of the green filter layer 301G arranged in the Bayer array BH may be replaced by a transmitting window 301T allowing incident light to transmit therethrough without being colored.

Alternatively, as illustrated in FIG. 13B, the rectangular segments of the red, green, and blue filter layers 301R, 301G, and 301B in the Bayer array BH may be placed with inclination of 45 degrees with respect to the vertical direction V and the horizontal direction H. That is, in the color filter 301, two rectangular segments of the green filter layer 301G may be arranged along the vertical direction V, and two rectangular segments of the red filter layer 301R and the blue filter layer 301B may be arranged along the horizontal direction.

Furthermore, as illustrated in FIG. 13C, the color filter 301 may be formed by using a colored array in which segments of a cyan filter layer 301C, a magenta filter layer 301M, an yellow filter layer 301Y, and a green filter layer 301G form a set of a colored array.

In the above-described embodiments, the present invention is applied to a CMOS image sensor, but the present invention may be applied to a CCD image sensor.

Also, in the above-described embodiments, a pigment is used as a coloring agent. However, the present invention is not limited to the pigment, and a dye may be used as a coloring agent.

What is claimed is:

1. A solid-state imaging device including a substrate of which a surface is provided with a pixel area where a plurality of pixels are arranged, and a surrounding area that is positioned around the pixel area and that includes a surrounding circuit, the solid-state imaging device comprising a color filter facing the substrate so as to receive the light from the subject image in a surface corresponding to the surface of the substrate and to allow the light to transmit therethrough onto the surface of the substrate, wherein:
    (a) the color filter comprises
        a first colored layer that has high light transmittance in a first wavelength band and that allows the light from the subject image to transmit therethrough,
        a second colored layer that has high light transmittance in a second wavelength band different from the first wavelength band and that allows the light from the subject image to transmit therethrough,
        a third colored layer that has high light transmittance in a third wavelength band different from the first and second wavelength bands and that allows the light from the subject image to transmit therethrough, and
        a fourth colored layer having a transmittance lower than the transmittance of any of the first to third colored layers;
    (b) a plurality of colored arrays of segments of the first, second, and third colored layers are arranged in the surface corresponding to the surface of the substrate, a first part of said plurality of colored arrays being placed in the pixel area and a second part being placed in the surrounding area, the colored arrays corresponding to the plurality of pixels in the pixel area; and
    (c) the fourth colored layer is laminated on the colored arrays to cover only the second part.

2. The solid-state imaging device according to claim 1, wherein the second colored layer covers a side surface of an endmost colored array among the plurality of colored arrays placed in the surrounding area.

3. The solid-state imaging device according to claim 1, wherein the first colored layer allows green light to transmit therethrough,
wherein the second colored layer allows red light to transmit therethrough,
wherein the third colored layer allows blue light to transmit therethrough.

4. A color filter facing a substrate to receive light from a subject image in a surface corresponding to a surface of the substrate and to allow the light to transmit therethrough onto the surface of the substrate, said surface being provided with a pixel area where a plurality of pixels are arranged and a surrounding area that is positioned around the pixel area and including a surrounding circuit, the color filter comprising:
    a first colored layer that has high light transmittance in a first wavelength band and that allows the light from the subject image to transmit therethrough;
    a second colored layer that has high light transmittance in a second wavelength band different from the first wavelength band and that allows the light from the subject image to transmit therethrough;
    a third colored layer that has high light transmittance in a third wavelength band different from the first and second wavelength bands and that allows the light from the subject image to transmit therethrough; and
    a fourth colored layer having a transmittance lower than the transmittance of any of the first to third colored layers,
wherein,
    a plurality of colored arrays of segments of the first, second and third colored layers are arranged in the surface corresponding to the surface of the substrate, a first part of said plurality of colored arrays being placed in the pixel area and a second part being placed in the surrounding area, the colored arrays corresponding to the plurality of pixels in the pixel area, and
    the fourth colored layer is laminated on the colored arrays to cover only the second part.

5. A camera including a solid-state imaging device including a substrate of which a surface is provided with a pixel area where a plurality of pixels are arranged, and a surrounding area that is positioned around the pixel area and that includes a surrounding circuit, the solid-state imaging device comprising a color filter facing the substrate so as to receive the light from the subject image in a surface corresponding to the surface of the substrate and to allow the light to transmit therethrough onto the surface of the substrate, wherein:
    (a) the color filter comprises
        a first colored layer that has high light transmittance in a first wavelength band and that allows the light from the subject image to transmit therethrough,
        a second colored layer that has high light transmittance in a second wavelength band different from the first wavelength band and that allows the light from the subject image to transmit therethrough,
        a third colored layer that has high light transmittance in a third wavelength band different from the first and second wavelength bands and that allows the light from the subject image to transmit therethrough, and
        a fourth colored layer having a transmittance lower than the transmittance of any of the first to third colored layers;
    (b) a plurality of colored arrays of segments of the first, second and third colored layers are arranged in the surface corresponding to the surface of the substrate, a first part of said plurality of colored arrays being placed in the pixel area and a second part being placed in the surrounding area, the colored arrays corresponding to the plurality of pixels in the pixel area; and
    (c) the fourth colored layer is laminated on the colored arrays to cover only the second part.

* * * * *